(12) United States Patent
Park

(10) Patent No.: US 8,029,291 B2
(45) Date of Patent: Oct. 4, 2011

(54) FLAT PLATE FOLDING TYPE COIL SPRING, POGO PIN AND MANUFACTURING METHOD

(76) Inventor: Sang Yang Park, Chungbuk (KR)

(*) Notice: Subject to any disclaimer, the term of this patent is extended or adjusted under 35 U.S.C. 154(b) by 0 days.

(21) Appl. No.: 13/055,779

(22) PCT Filed: Jul. 13, 2009

(86) PCT No.: PCT/KR2009/003815
§ 371 (c)(1),
(2), (4) Date: Jan. 25, 2011

(87) PCT Pub. No.: WO2010/016663
PCT Pub. Date: Feb. 11, 2010

(65) Prior Publication Data
US 2011/0124243 A1    May 26, 2011

(30) Foreign Application Priority Data

Aug. 7, 2008   (KR) .................. 10-2008-0077238
Aug. 14, 2008  (KR) .................. 10-2008-0079910
Jun. 18, 2009  (KR) .................. 10-2009-0054228

(51) Int. Cl.
*H01R 12/00* (2006.01)
(52) U.S. Cl. ........................................... 439/66
(58) Field of Classification Search ............ 439/66, 439/74, 75, 76.1, 79, 82
See application file for complete search history.

(56) References Cited

U.S. PATENT DOCUMENTS

| | | | |
|---|---|---|---|
| 3,258,736 A * | 6/1966 | Clawford et al. | 439/786 |
| 5,542,775 A | 8/1996 | Bechtoldt et al. | |
| 6,264,476 B1 * | 7/2001 | Li et al. | 439/66 |
| 6,471,525 B1 * | 10/2002 | Fan et al. | 439/70 |
| 2002/0098721 A1 * | 7/2002 | Fan et al. | 439/66 |
| 2005/0026512 A1 | 2/2005 | Seidler | |
| 2006/0189176 A1 * | 8/2006 | Li | 439/66 |
| 2006/0211276 A1 * | 9/2006 | Li | 439/66 |
| 2010/0041251 A1 * | 2/2010 | Nakayama | 439/65 |

FOREIGN PATENT DOCUMENTS

| | | |
|---|---|---|
| KR | 10-0540842 | 1/2006 |
| KR | 10-0576050 | 5/2006 |

OTHER PUBLICATIONS

International Search Report mailed Feb. 25, 2010 for PCT/KR2009/003815.

* cited by examiner

*Primary Examiner* — Tulsidas Patel
*Assistant Examiner* — Phuong Nguyen
(74) *Attorney, Agent, or Firm* — Lowe Hauptman Ham & Berner LLP

(57) ABSTRACT

A coil spring, a pogo pin having the coil spring, and manufacturing methods thereof are provided. The method for manufacturing a coil spring includes i) preparing a metal strip 200 with a periodically repeated U- or S-shape pattern, and ii) bending the metal strip 200 at one or more inward bending points 210 and at one or more outward bending point 220, which are formed on the metal strip 200, in opposite directions, the inward bending point and the outward bending point being spaced apart from each other. The coil spring and the pogo pin may be manufactured to be small in size and low in manufacturing costs as compared with conventional ones. Further, the coil spring and the pogo pin may provide a sufficient maximum range of motion and spring force of a probe.

20 Claims, 8 Drawing Sheets

[Fig. 1]
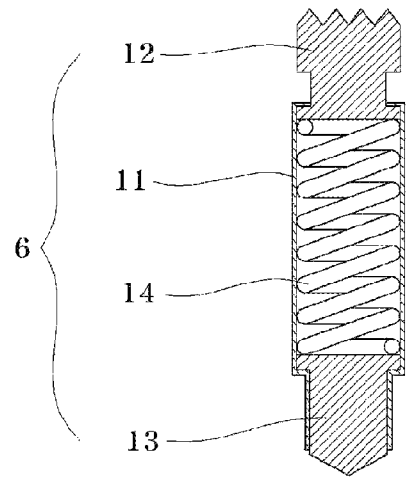
[Fig. 2]
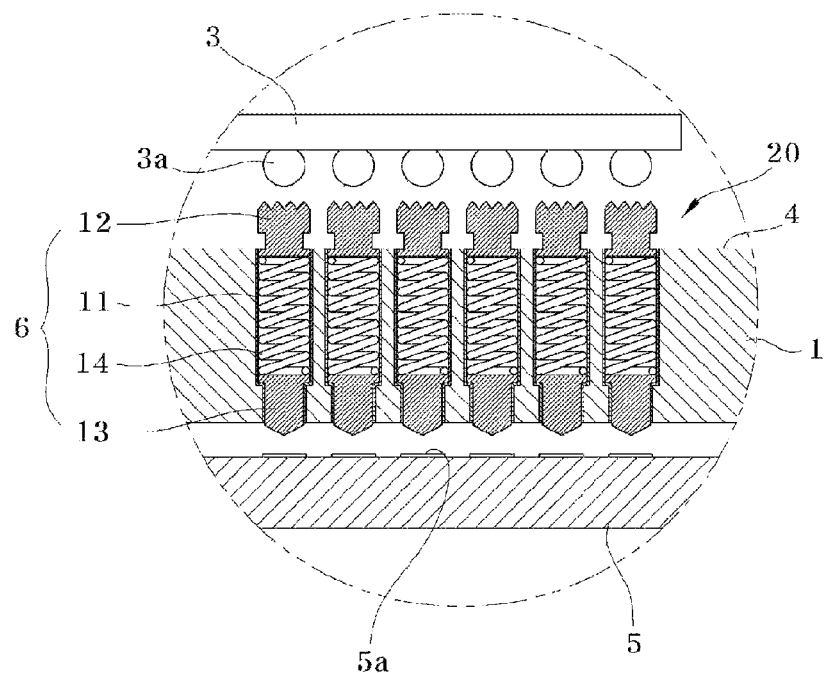
[Fig. 3]
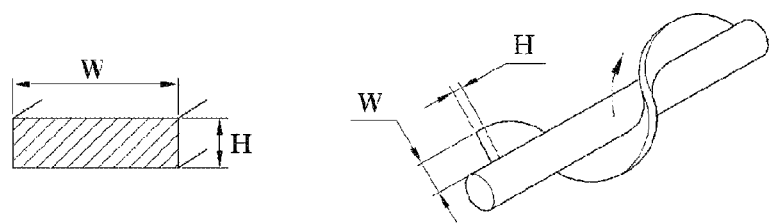

[Fig. 4]
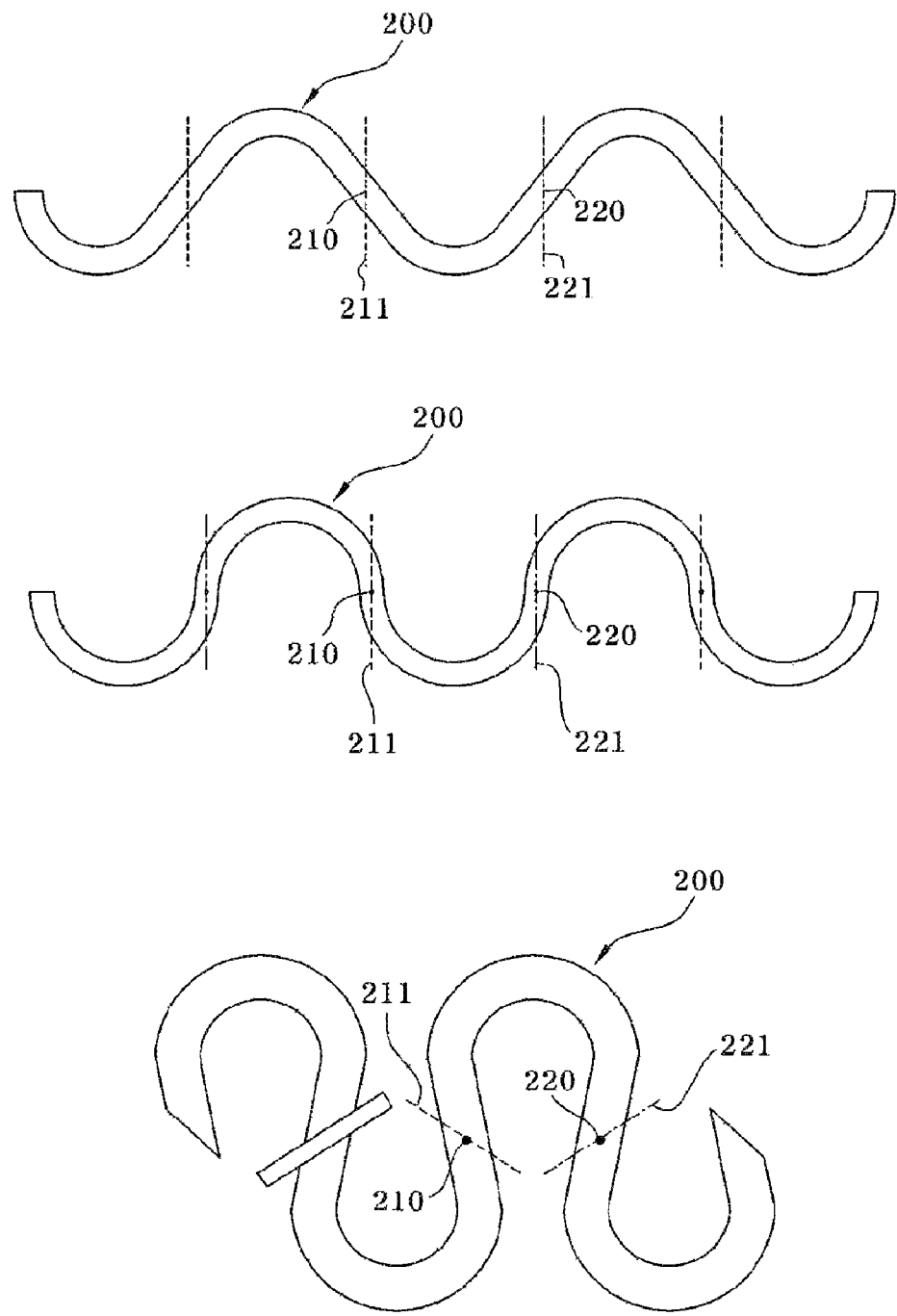

[Fig. 5]
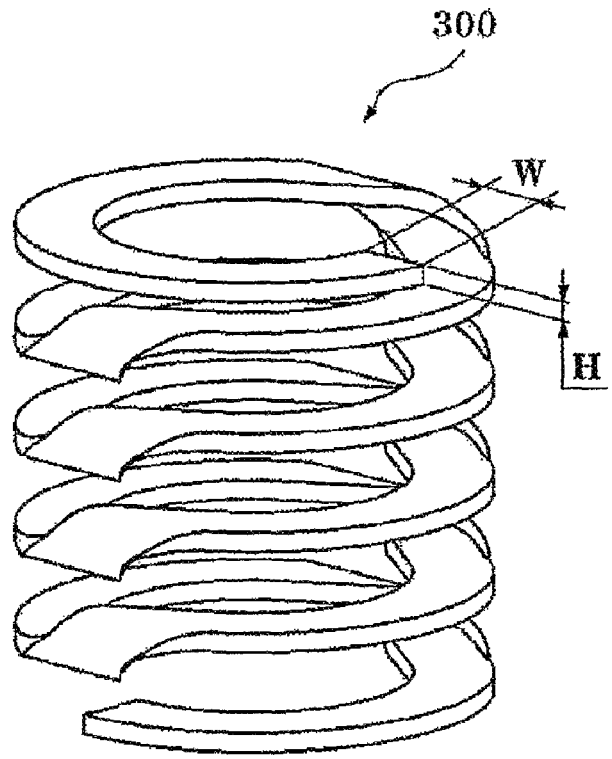
[Fig. 6]
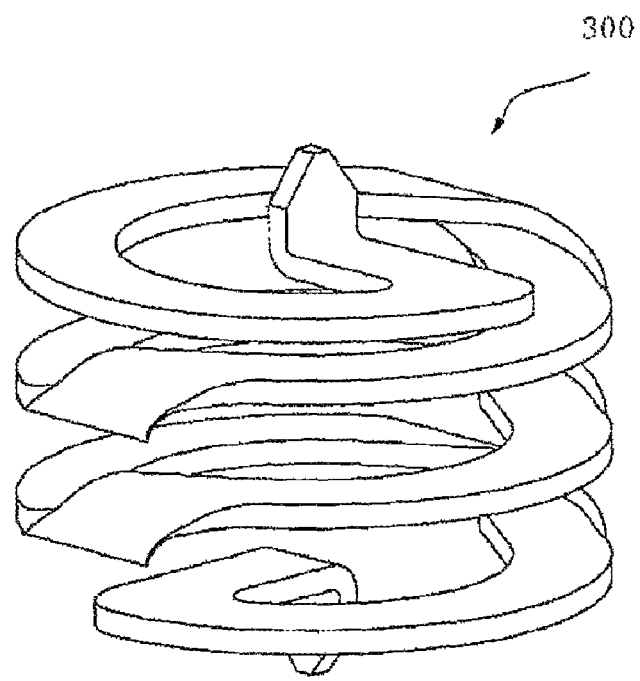

[Fig. 7]
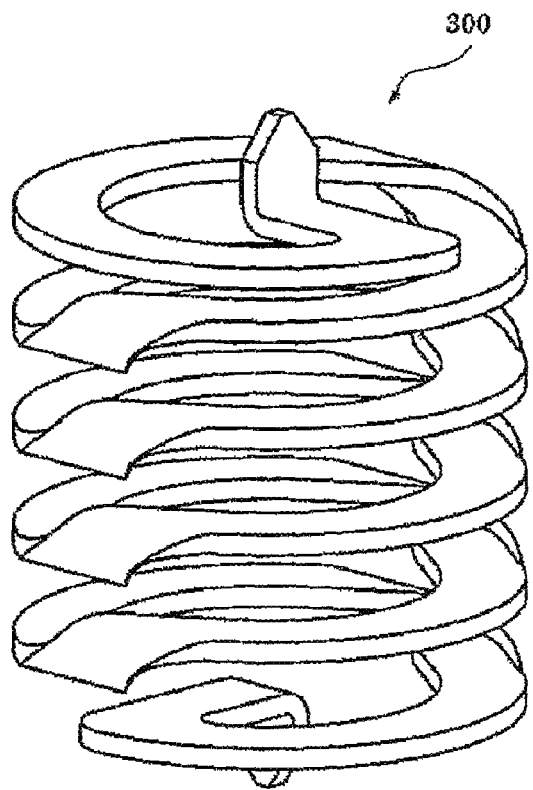
[Fig. 8]
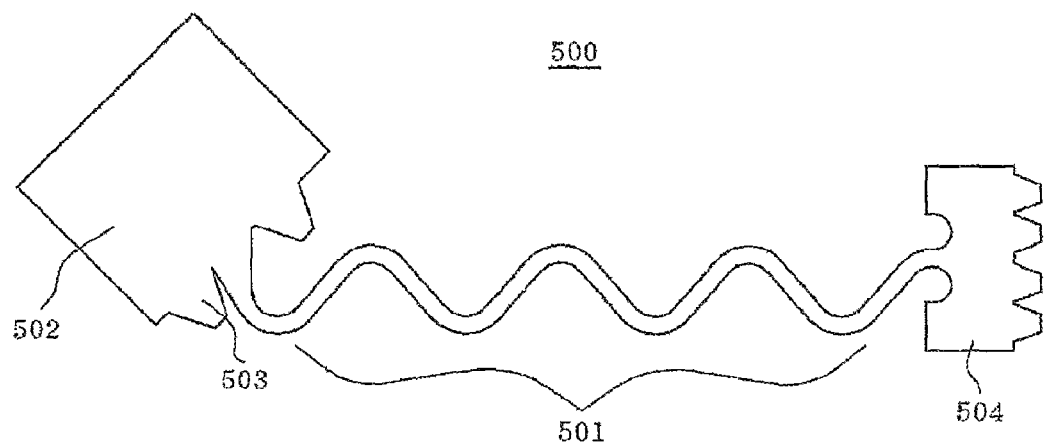

[Fig. 9]
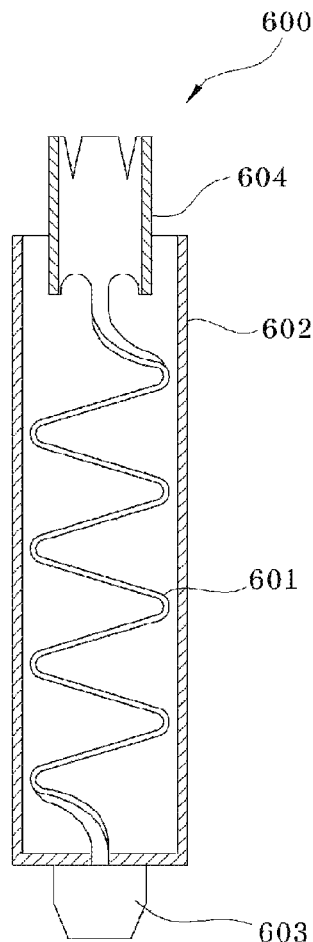
[Fig. 10]
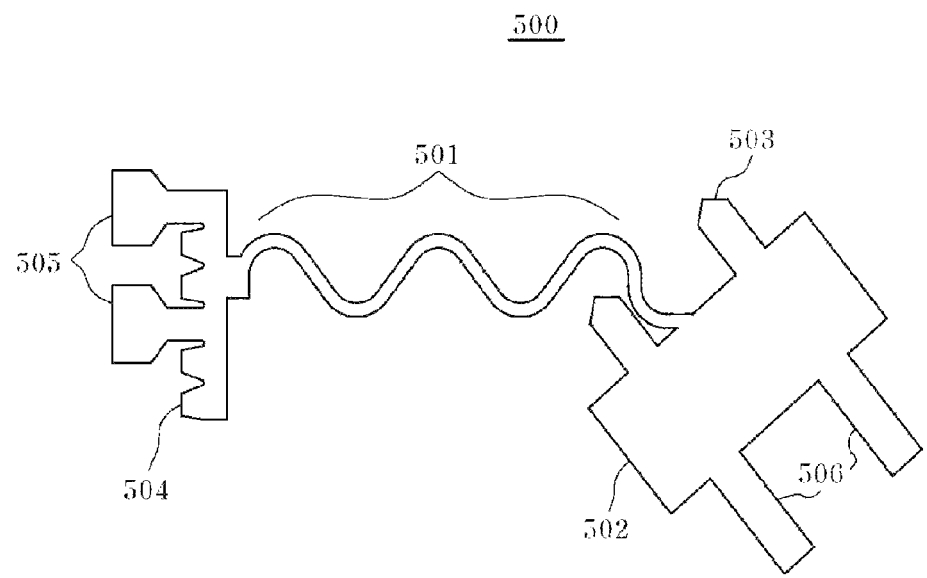

[Fig. 11]
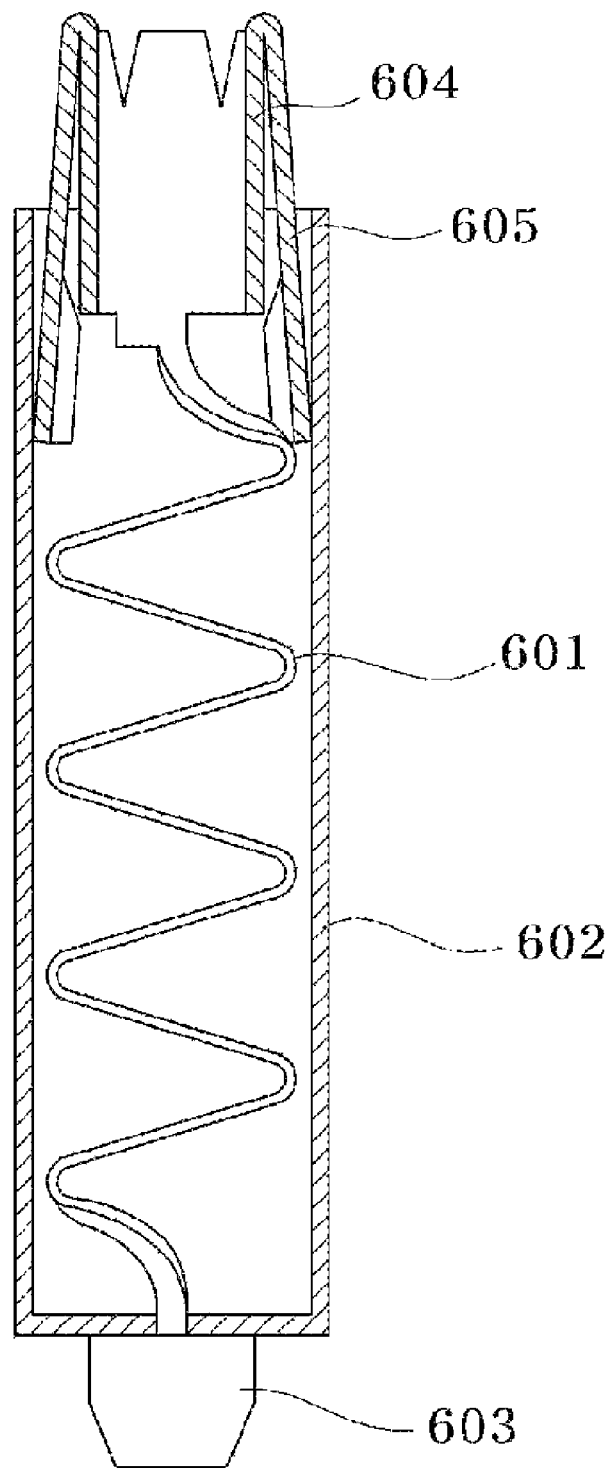

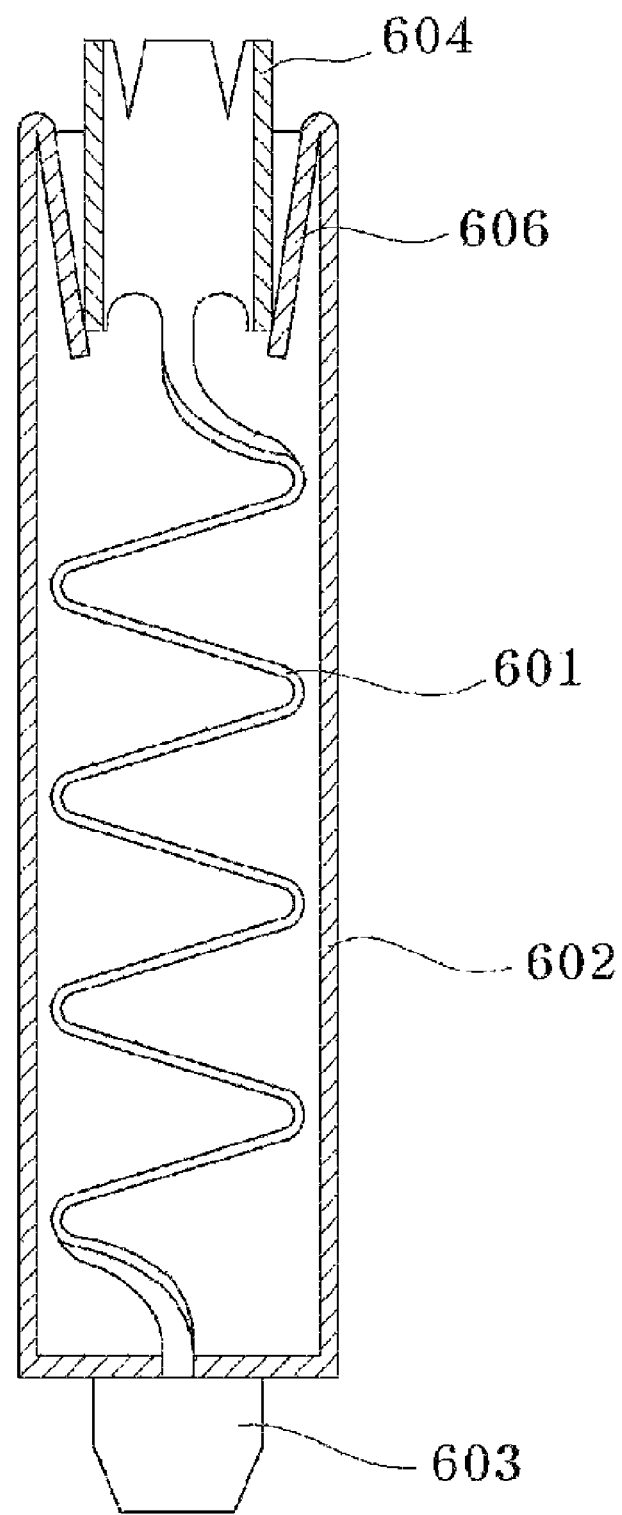
[Fig. 12]

[Fig. 13]
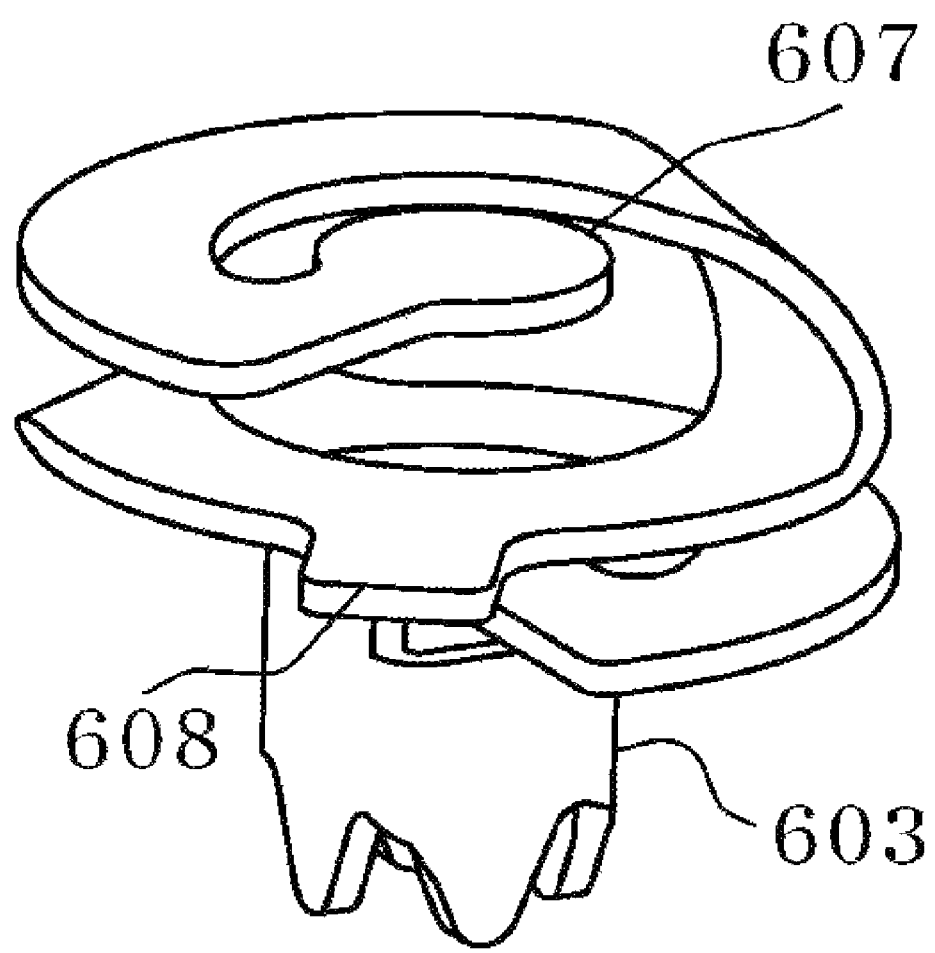

FLAT PLATE FOLDING TYPE COIL SPRING, POGO PIN AND MANUFACTURING METHOD

CROSS REFERENCE TO RELATED APPLICATION

This application claims the priority of Korean Patent Application No. 10-2008-0077238, filed on Aug. 7, 2008, Korean Patent Application No. 10-2008-0079910, filed on Aug. 14, 2008, and Korean Patent Application No. 10-2009-0054228, filed on Jun. 18, 2009, in the KIPO (Korean Intellectual Property Office), the disclosure of which are incorporated herein in their entirety by reference. Further, this application is the National Phase application of International Application No. PCT/KR2009/003815, filed Jul. 13, 2009, which designates the United States and was published in Korean. Each of these applications is hereby incorporated by reference in their entirety into the present application.

TECHNICAL FIELD

The following description relates to a miniaturized coil spring which is formed by bending a metal strip in a periodically repeated pattern, a pogo pin employing the coil spring, and methods for manufacturing the coil spring and the pogo pin.

BACKGROUND ART

Pogo pins are widely used in inspection devices or sockets for semiconductor wafers, LCD modules, and semiconductor packages, and battery connectors for cell phones.

FIG. 1 illustrates a conventional pogo pin 6.

Referring to FIG. 1, the pogo pin 6 includes a cylindrical pin body 11, a coil spring 14 inserted in the pin body 11, and upper and lower probes 12 and 13 disposed at both ends of the coil spring 14.

FIG. 2 is a cross-sectional view of a conventional socket used in inspecting a semiconductor package. In FIG. 2, the pogo pin is used to establish a connection between an external terminal of the semiconductor package and a metallic wire on a printed circuit board.

Referring to FIG. 2, the socket 20 includes pogo pins 6 and a main body 1. The pogo pin 6 is used to establish an electrical connection between an external terminal 3a of a semiconductor package 3 and a contact pad 5a of a test board 5. The main body 1 is used to support the pogo pins 6 so that the pogo pins 6 may be arranged at regular intervals and be protected from deformation or damage.

The pogo pin 6 includes a pipe-shaped pin body 11, a metallic upper probe 12, a metallic lower probe 13, and a coil spring 14. The upper probe 12 is coupled to a top side of the pin body 11 to come into contact with the external terminal 3a of the semiconductor package 3. The lower probe 13 is coupled to a bottom side of the pin body 11 to come into contact with the contact pad 5a of the test board 5. The coil spring 14 is disposed in the pin body 11 and comes into contact with the upper and lower probes 12 and 13 to allow the upper and lower probes 12 and 13 to elastically come into contact with the external terminal 3a of the package 3 and the contact pad 5a of the test board 5, respectively, when inspection is conducted.

The pogo pin 6 is preferably small in size so as to be suited to increasingly miniaturized and integrated semiconductor packages. A reduced distance between the external terminals 3a inherently leads to a decrease in the outer diameter of the pogo pin 6. Further, the pogo pin 6 needs to be minimized in length to reduce electrical resistance between the semiconductor is package 3 and the test board 5.

For instance, in order to reduce the distance between the semiconductor package 3 and the test board 5 to 0.95 mm or shorter, the pogo pin 6 needs to have a length of 0.95 mm or shorter accordingly.

On the other hand, in order to securely establish electrical contact between the external terminal 3a of the semiconductor package 3 and the upper probe 12 and between the contact pad 5a and the lower probe 13, the range of motion of the upper probe 12 and the range of motion of the lower probe 13 are preferably as large as possible. However, in the case of a conventional pogo pin with a size as small as 0.95 mm or shorter, providing a sufficient range of motion is not possible.

For example, in the case of a pogo pin with a length of 0.95 mm, the coil spring 14 can have a range of motion of no more than about 0.6 mm, except for a space for the upper and lower probes. In this case, a coil spring of ten turns each having a diameter of 0.06 mm takes up at least 0.6 mm. On the other hand, a reduced diameter of a coil spring may result in a decreased spring force or electrical signal loss. Besides, a decreased number of turns of a coil spring may not provide a sufficient range of motion within a limited range of elasticity of the coil spring.

DISCLOSURE OF INVENTION

Technical Problem

The present invention meets the above needs and overcomes one or more deficiencies in the related art. It should be noted that the following objectives are intended for illustrative purposes only.

The present invention is intended to provide a miniaturized coil spring which is formed by bending a metal strip in a periodically repeated pattern and allows a probe to have a is satisfactory range of motion, a pogo pin employing the coil spring, and methods for manufacturing the coil spring and the pogo pin.

The present invention is also intended to provide a miniaturized coil spring which is formed by bending a metal strip in a periodically repeated pattern and has a satisfactory spring force, a pogo pin employing the coil spring, and methods for manufacturing the coil spring and the pogo pin.

The present invention is also intended to provide a miniaturized coil spring which is formed by bending a metal strip in a periodically repeated pattern and has a low electrical resistance, a pogo pin employing the coil spring, and methods for manufacturing the coil spring and the pogo pin.

Technical Solution

The present invention provides a coil spring for use in a pogo pin, which is made of a metal strip with a periodically repeated pattern, the pogo pin including the coil spring being manufactured from the metal strip as a single integrated structure.

In one general aspect, a coil spring made of a metal strip with a periodically repeated pattern of U- or S-shape is provided. The metal strip includes one or more inward bending points and one or more outward bending points, the inward bending points and the outward bending points being bent in opposite directions and being spaced apart from each other.

In another general aspect, a method for manufacturing a coil spring using a metal strip includes i) preparing the metal strip with a periodically repeated pattern of U- or S-shape, and ii) bending the metal strip at one or more inward bending points of the metal strip and at one or more outward bending points of the metal strip in an opposite direction to each other, where the inward bending point and the outward bending point are spaced apart from each other.

In still another general aspect, a pogo pin includes a coil spring 601 made of a metal strip which includes one or more inward bending points and one or more outward bending points, the inward bending points and the outward bending points being bent in opposite directions and being spaced apart from each other; a body 602 surrounding the coil spring; and an upper probe 604 elastically supported by the coil spring 601 and moving up and down with respect to the body 602; where the coil spring 601, the body 602 and the upper probe 604 are formed into a unified body formed of the metal strip.

In yet another general aspect, a method for manufacturing a pogo pin includes i) preparing a metal plate 500 which includes a spring part 501 made of a metal strip with a periodically repeated pattern, a body part 502 coupled with one end of the spring part 501, and an upper probe part 504 coupled with the other end of the spring part 501, where the spring part 501, the body part 502 and the upper probe part 504 are combined into one united body; ii) forming a coil spring 601 by bending the spring part 501 at an inward bending point of the spring part 501 and at an outward bending point of the spring part 501 in opposite directions, where the s inward bending point and the outward bending point are spaced apart from each other; and iii) forming an upper probe 604 by bending the upper probe part 504 into a cylindrical shape, where the body part 502 is bent into a cylindrical body 602 and the upper probe 604 is elastically supported by the coil spring 601 and is moved up and down with respect to the body 602.

In yet another general aspect, a pogo pin includes a coil spring made of a metal strip with one or more bending points, the bending point being provided on a first plane of the metal strip and the metal strip being bent at the bending point in an inward or outward direction with respect to the first plane of the metal strip; a first contact 607 which is elastically supported by the coil spring and is moved up and down; a second contact 603 which is elastically supported by the coil spring and is moved up and down; and a protrusion 608 protruding laterally from the is metal strip of the coil spring so that the coil spring may be securely situated and maintained in an original shape thereof; where the coil spring, the first contact 607, the second contact 603 and the protrusion 608 are formed into a unified body formed of the metal strip.

Other features and aspects will be apparent from the following detailed description, the drawings, and the claims.

Advantageous Effects

The exemplary coil spring may be manufactured to be smaller than a conventional one and have a metal strip whose cross section has a high width to height ratio, thereby securing a sufficient range of motion of a probe and a satisfactory spring force.

Further, the exemplary coil spring may be manufactured to have a wide cross section, thus reducing electrical resistance.

In addition, the exemplary pogo pin employing the exemplary coil spring may be manufactured by bending a metal strip, thereby reducing manufacturing costs. The miniaturized pogo pin may allow the probe to have a sufficient maximum range of motion.

BRIEF DESCRIPTION OF THE DRAWINGS

FIG. 1 illustrates a conventional pogo pin 6.

FIG. 2 is a cross-sectional view of a conventional socket used in inspecting a semiconductor package.

FIG. 3 illustrates a coiling operation using a metal strip.

FIG. 4 is a top view of a metal strip used for a coil spring according to an exemplary embodiment of the present invention.

FIG. 5 illustrates an example of a coil spring 300 which is formed by bending a metal strip is in a periodically repeated pattern according to an exemplary embodiment of the present invention.

FIG. 6 illustrates another example of a coil spring 300 which is formed by bending a metal strip in a periodically repeated pattern according to an exemplary embodiment of the present invention.

FIG. 7 illustrates still another example of a coil spring 300 which is formed by bending a metal strip in a periodically repeated pattern according to an exemplary embodiment of the present invention.

FIG. 8 illustrates an example of a metal plate 500 used in manufacturing a pogo pin employing the coil spring.

FIG. 9 illustrates a pogo pin 600 which is formed using the metal plate 500 of FIG. 6.

FIG. 10 illustrates another example of a metal plate 500 further including first and second protruding parts 505 and 506 to be used in manufacturing the pogo pin.

FIG. 11 illustrates a pogo pin 600 formed using a metal plate 500 which is formed by adding a first protruding part 505 to the metal plate 800 of FIG. 8.

FIG. 12 illustrates a pogo pin 600 formed using a metal plate 500 which is formed by adding a second protruding part 506 to the metal plate 800 of FIG. 8.

FIG. 13 illustrates a pogo pin having a protrusion.

Throughout the drawings and the detailed description, unless otherwise described, the same reference numerals will be understood to refer to the same elements, features, and structures. The relative size and depiction of these elements may be exaggerated for clarity, illustration, and convenience.

MODE FOR THE INVENTION

Exemplary embodiments of the present invention will now be described in detail below with reference to the accompanying drawings, which are incorporated in their entirety by reference herein The following description is provided to assist the reader in gaining a comprehensive understanding of the methods, apparatuses, and/or systems described herein. Accordingly, various changes, modifications, and equivalents of the methods, apparatuses, and/or systems described herein will be obvious to those of ordinary skill in the art. Also, descriptions of well-known functions and constructions may be omitted for clarity and conciseness. Likewise, it should be noted that the drawings are not to precise scale and some of the dimensions are exaggerated for clarity of description in the drawings. In addition, like elements are denoted by like reference numerals throughout the specification and drawings.

1. Coil Spring and Manufacturing Method Thereof

In one embodiment, a coil spring is manufactured using a metal strip. For instance, a metal strip with a cross section shown on the left side of FIG. 3 is employed.

For a metal plate with a width W and a height (or thickness) H, the metal plate needs to s have a sectional area (W×H) greater than a predetermined value for a coil spring to have a satisfactory spring force. For example, for a pogo pin to be short in length, the height H should be as low as possible and the width W should thus be wide.

FIG. 3 illustrates a coiling operation using a metal strip. It should be noted that the coiling operation of FIG. 3 is not intended to limit the present embodiment and is provided for illustrative purposes only.

Referring to FIG. 3, is not easy to perform the coiling operation using a metal strip with a predetermined ratio or greater of width to height (W/H). That is, the metal strip may tip over during the coiling operation. In the present embodiment, a new coiling operation is presented.

FIG. 4 is a top view of a metal strip used for a coil spring according to an exemplary is embodiment of the present invention Referring to FIG. 4, a metal strip 200 with a predetermined width is provided in a periodically repeated pattern of S-, U- or other shapes. The metal strip 200 is bent in one direction at an inward bending point 210 and bent in the opposite direction at an outward bending point 220. The inward bending point 210 is a point where the metal strip 200 is bent inwards with respect to a first plane of the metal strip 200, while the outward bending point 220 is a point where the metal strip 200 is bent outwards with respect to the first plane of the metal strip 200. The inward and outward bending points 210 and 220 each indicate central bending points. The metal strip 200 is substantially bent along inward and outward bending lines 211 and 221. The inward and outward bending lines 211 and 221 are each provided to cross the metal plate 200. The bends of the metal strip 200 may be sharp bends or radiused bends having a radius of curvature R.

The inward bending point 210 and the outward bending point 220 are spaced apart from each other. The inward bending point 210 and the outward bending point 220 may vary in position. In the top two drawings of FIG. 4, the metal strip 200 is bent at a point where a V- or U-shaped pattern is periodically repeated.

FIG. 5, 6 or 7 illustrates a coil spring 300 which is formed by a progressive bending operation where a metal strip is bent in a periodically repeated pattern. FIG. 5 illustrates a coil spring 300 whose end portion is placed on the same plane as the outer diameter. FIG. 6 or 7 illustrates a coil spring 300 whose end portion is extended inwards and then bent upwards or downwards at right angles.

In the present embodiment, the coil spring 300 manufactured through the progressive bending operation includes the metal plate with a relatively high width to height (W/H) ratio. Hence, as compared with a conventional coil spring of the same size, the probe may have a is greater maximum range of motion and the coil spring 300 may have a stronger spring force due to improved mechanical strength.

The progressive bending operation may employ progressive stamping. The metal strip may be made of a material which undergoes a predetermined degree of elongation during the bending operation, is easily increased in elasticity and strength by the following heat treatment operation, and has a low electrical resistance. Accordingly, the metal strip may be made of, but is not limited to, beryllium copper, especially beryllium copper 25, i.e., ASTM C17200.

Before or after the bending operation, plating and heat treatment operations may be optionally added. A material with a low electrical resistance, such as gold, may be used as a plating material. Annealing, normalizing, quenching or tempering may be performed for heat treatment.

2. Pogo Pin Employing the Coil Spring and Manufacturing Method Thereof

A conventional pogo pin may be used to manufacture a pogo pin employing the exemplary coil spring. However, for the conventional pogo pin manufactured with a combination of a number of components, the manufacturing process is not simple since the pogo pin is small in size and manufacturing costs are very high.

In one embodiment, a pogo pin employing the coil spring is manufactured with a metal plate, thereby reducing manufacturing costs and improving mechanical and electrical reliability.

FIG. 8 illustrates an example of a metal plate 500 used in manufacturing a pogo pin employing the coil spring. FIG. 9 illustrates a pogo pin 600 which is formed using the metal plate 500 of FIG. 8.

The metal plate 500 includes a spring part 501, a body part 502, a lower probe part 503, and an upper probe part 504, which are combined into a unified body.

The spring part 501 is formed into a coil spring 601 which is bent alternately inwards and outwards at a plurality of bending points as described above. The upper probe part 504 is bent into a pipe- or square-shaped upper probe 604 which is provided to come into contact with a target subject. The body part 502 and the lower probe part 503 are bent into a body 602 and a lower probe 603, respectively.

The metal plate 500 including the spring part 501, which is made of a metal strip bent in a periodically repeated pattern of, for example, V-, U- or S-shape, the body part 502 coupled to one end of the spring part 501, the upper probe part 504 coupled to the other end of the spring part 501, and the lower probe part 503 coupled to the body part 502 is provided to manufacture a pogo pin. The spring part 501, the body part 502, the lower probe part 503, and the upper probe part 504 are combined into a unified body.

The coil spring 601 is formed by bending the spring part 501 alternately inwards and outwards at inward and outward bending points of the spring part 501. The inward and outward s bending points are spaced apart from each other. The inward bending point is a point where the metal plate is bent inwards with respect to a first plane of the metal plate, while the outward bending point is a point where the metal plate is bent outwards with respect to the first plane of the metal plate. The upper probe part 504 is bent into a pipe- or square-shaped upper probe 604. The body part 502 is bent into a cylindrical body 602, and the lower probe part 503 is bent into a lower probe 603. The spring part 501, the upper probe part 504, the body part 502 and the lower probe part 503 may be bent in random order. For instance, the lower probe part 503 may be bent before or after the body part 502 is bent. The upper probe 604 and the lower probe 603 may be interchangeable in functionality.

The upper probe 604 may be elastically supported by the coil spring 601 and may move is up and down with respect to the body 602.

The lower probe 603 may be elastically supported by the coil spring 601 and may move up and down with respect to the upper probe 604.

The body part 502 and the body 602 may be omitted.

Progressive stamping may be applied to bend the spring part 501, the body part 502, the lower probe part 503 and the upper probe part 504.

Accordingly, the pogo pin 600 is manufactured in such a manner that the upper probe 604 is moved up and down within the body 602 by the elastic coil spring 601 to come into contact with a target subject, such as a semiconductor lead.

FIG. 10 illustrates another example of a metal plate 500 further including first and second protruding parts 505 and 506 to be used in manufacturing the pogo pin.

The metal plate 500 of FIG. 10 is identical to the metal plate 500 of FIG. 8 except that the metal plate 500 of FIG. 10 further includes the first and second protruding parts 505 and 506.

Referring to FIG. 10, the first protruding part 505 is coupled to the upper probe part 504, while the second protruding part 506 is coupled to the body part 502. Although FIG. 10 illustrates the metal plate 500 as further including the first and second protruding parts 505 and 506, the metal plate 500 may further include one of the first and second protruding parts 505 and 506.

FIG. 11 illustrates a pogo pin 600 formed using a metal plate 500 which is formed by adding a first protruding part 505 to the metal plate 500 of FIG. 10.

FIG. 12 illustrates a pogo pin 600 formed using a metal plate 500 which is formed by adding a second protruding part 506 to the metal plate 500 of FIG. 10.

Referring to FIG. 11, when the first protruding part 505 is formed on the upper probe part 504, the first protruding part 505 is bent towards the outer diameter of the upper probe 604 to be is formed into a first protruding contact 605 which is provided to come into contact with an inner wall of the body 602. On the other hand, referring to FIG. 12, when the second protruding part 506 is formed on the body part 502, the second protruding part 506 is bent towards the inner diameter of the body 602 to be formed into a second protruding contact 606 which is provided to come into contact with the upper probe 604 which is moved up and down within the body 602.

The first and second protruding contacts 605 and 606 may be used to shorten an electrical signal path within the pogo pin and to increase a sectional area of the electrical signal path, thereby reducing attenuation of an electrical signal.

When the lower probe 603 is not needed in the pogo pin, the lower probe part 503 need not be formed on the body part 502.

The pogo pin employing the coil spring may be made of a material which undergoes a predetermined degree of elongation during the bending operation, is easily increased in elasticity and strength by heat treatment, and has a low electrical resistance. Accordingly, the material may be, but is not limited to, beryllium copper, especially beryllium copper 25, i.e., ASTM C17200.

Before or after the bending operation, plating and heat treatment operations may be optionally added. A material with a low electrical resistance, such as gold, may be used as a plating material. Annealing, normalizing, quenching or tempering may be performed for heat treatment.

3. Pogo Pin with Protrusion

FIG. 13 illustrates a pogo pin 700 having a protrusion.

A spring part is basically identical to the coil spring described above. In other words, the spring part is formed of a metal strip with one or more bending points. The bending point is a point where the metal strip is bent inwards or outwards with respect to a first plane of the metal strip.

A first contact 607 is elastically supported by the coil spring and is moved up and down. Although the first contact 607 is formed of a circular plane in FIG. 13, the first contact 607 may be formed of a square-shaped, crown-shaped or differently shaped plane.

A second contact 603 is elastically supported by the coil spring and is moved up and down. Although the second contact 603 is formed of a crown-shaped plane in FIG. 13, the second contact 603 may be formed of a circular, square-shaped or differently shaped plane.

The pogo pin 700 further includes a protrusion 608 which protrudes laterally from the metal strip of the coil spring so that the coil spring may be securely situated and maintained in an original shape thereof. The protrusion 608 may vary in shape so long as the protrusion 608 protrudes from the metal strip. When the pogo pin 700 is disposed within a different device, the pogo pin 700 may not be maintained in its original shape, for example, may be undesirably rotated or lean to one side. The protrusion 608 may be used to prevent the pogo pin 700 from deformation when the pogo pin 700 is disposed within a different device.

The coil spring, the first contact 607, the second contact 603, and the protrusion 608 are formed into a single unified body formed of the metal strip.

As apparent from the above description, the coil spring and the pogo pin may be manufactured to be relatively small as compared with conventional ones and manufactured by progressive stamping, thereby reducing the manufacturing costs. Furthermore, the pogo pin allows the probe to have a sufficient range of motion and the coil spring may be manufactured to have a sufficient spring force.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or is supplemented by other components or their equivalents. Accordingly, other implementations fall within the scope of the following claims.

INDUSTRIAL APPLICABILITY

The pogo pin thus manufactured may be widely used in inspection devices or sockets for semiconductor wafers, LCD modules, and semiconductor packages, connectors for cell phone batteries or computer CPUs, DC testers or burn-in testers for semiconductors, fine connectors and so on.

The invention claimed is:

1. A coil spring made of a metal strip with a periodically repeated pattern, wherein
  the metal strip includes one or more inward bending points and one or more outward bending points, the inward bending points and the outward bending points being bent in opposite directions, and wherein
  the metal strip is bent at the inward bending point in an inward direction with respect to a first plane of the metal strip and is bent at the outward bending point in an outward direction with respect to the first plane of the metal strip, the inward bending point and the outward bending point being spaced apart from each other to form a continues sheet wound in a helical shape and a first protruding contact and a second protruding contact are extending in up and down directions with respective to a unified body of the metal strip.

2. The coil spring of claim 1, wherein the pattern is V-, U- or S-shaped.

3. The coil spring of claim 1, wherein the metal strip is made of beryllium copper.

4. The coil spring of claim 1, wherein the metal strip is plated with gold.

5. A method for manufacturing a coil spring using a metal strip, the method comprising:
  i) preparing the metal strip with a periodically repeated pattern; and
  ii) bending the metal strip at one or more inward bending points of the metal strip in an inward direction with respect to a first plane of the metal strip and bending the metal strip at one or more outward bending points of the metal strip in an outward direction with respect to the first plane of the metal strip, the inward bending point and the outward bending point being spaced apart from each other to form a continues sheet wound in a helical shape and a first protruding contact and a second protruding contact are extending in up and down directions with respective to a unified body of the metal strip.

6. The method of claim 5, wherein the pattern is V-, U- or S-shaped.

7. The method of claim 5, wherein the metal strip is made of beryllium copper.

8. The method of claim 5, wherein the metal strip is plated with gold.

9. The method of claim 5, further comprising, after ii) the bending of the metal strip, performing at least one of annealing, normalizing, quenching and tempering operations.

10. A pogo pin comprising:
a coil spring made of a metal strip including one or more inward bending points and one or more outward bending points, the inward bending points and the outward bending points being bent in opposite directions and the inward bending point and the outward bending point being spaced apart from each other to form a continues sheet wound in a helical shape; and
a body surrounding the coil spring; and
an upper probe elastically supported by the coil spring and moving up and down direction with respect to the body; wherein
the coil spring, the body and the upper probe are formed into a unified body formed of the metal strip.

11. The pogo pin of claim 10, further comprising a lower probe coupled with the body.

12. The pogo pin of claim 10, further comprising a first protruding contact and/or a second protruding contact,
wherein the first protruding contact extends from the upper probe and is bent towards an outer diameter of the upper probe to come into contact with an inner wall of the body, and the second protruding contact extends from the body and is bent towards an inner diameter of the body to come into contact with the upper probe.

13. A method for manufacturing a pogo pin, the method comprising:
i) preparing a metal plate which includes a spring part made of a metal strip with a periodically repeated pattern, a body part coupled with one end of the spring part, and an upper probe part coupled with the other end of the spring part, wherein the spring part, the body part and the upper probe part are combined into a single unified body;
ii) forming a coil spring by bending the spring part at an inward bending point of the spring part and at an outward bending point of the spring part in opposite directions, wherein the inward bending point and the outward bending point are spaced apart from each other to form a continues sheet wound in a helical shape; and
iii) forming an upper probe by bending the upper probe part into a cylindrical shape, wherein the body part is bent into a cylindrical body and the upper probe is elastically supported by the coil spring and is moved up and down with respect to the body.

14. The method of claim 13, wherein the metal plate further comprises a lower probe part coupled to the body part, and
wherein before or after the body part is bent into the cylindrical body, the lower probe part is bent into a lower probe.

15. The method of claim 13, wherein the metal plate further comprises a first protruding part coupled to the upper probe part, and
wherein the first protruding part is bent towards an outer diameter of the upper probe to be formed into a first protruding contact which is provided to come into contact with an inner wall of the body.

16. The method of claim 13, wherein the metal plate further comprises a second protruding part coupled to the body part, and
wherein the second protruding part is bent towards an inner diameter of the body to be formed into a second protruding contact which is provided to come into contact with the upper probe.

17. The method of claim 13, further comprising, after iii) the forming of the upper probe, performing at least one of annealing, normalizing, quenching and tempering operations.

18. A pogo pin comprising:
a coil spring made of a metal strip with one or more bending points, the bending point being provided on a first plane of the metal strip and the metal strip being bent at the bending point in an inward or outward direction with respect to the first plane of the metal strip;
a first contact which is elastically supported by the coil spring and is moved up and down;
a second contact which is elastically supported by the coil spring and is moved up and down; and
a protrusion protruding laterally from the metal strip of the coil spring so that the coil spring may be securely situated and maintained in an original shape thereof; wherein
the coil spring, the first contact, the second contact and the protrusion are formed into a continues sheet wound in a helical shape with respective to a unified body of the metal strip.

19. A pogo pin comprising:
a coil spring made of a metal strip, the metal strip including one or more inward bending points and one or more outward bending points and being bent at the inward bending point and at the outward bending point in opposite directions, and the inward bending point and the outward bending point being spaced apart from each other to form a continues sheet wound in a helical shape; and
an upper probe which is elastically supported by the coil spring and is moved up and down; and
a lower probe which is elastically supported by the coil spring and is moved up and down; wherein
the coil spring, the upper probe and the lower probe are formed into a unified body formed of the metal strip.

20. A method for manufacturing a pogo pin, the method comprising:
i) preparing a metal plate which includes a spring part made of a metal strip with a periodically repeated pattern, an upper probe part coupled with one end of the spring part, and a lower probe part coupled with the other end of the spring part, wherein the spring part, the upper probe part and the lower probe part are combined into a unified body;
ii) forming a coil spring by bending the spring part at an inward bending point of the spring part and at an outward bending point of the spring part in opposite directions, wherein the inward bending point and the outward bending point are spaced apart from each other; and
iii) forming an upper probe by bending the upper probe part into a continues sheet wound in a helical shape, wherein the upper probe is elastically supported by the coil spring and is moved up and down.

* * * * *